(12) United States Patent
Dirnecker et al.

(10) Patent No.: US 8,803,287 B2
(45) Date of Patent: Aug. 12, 2014

(54) ELECTRONIC DEVICE COMPRISING A SEMICONDUCTOR STRUCTURE HAVING AN INTEGRATED CIRCUIT BACK END CAPACITOR AND THIN FILM RESISTOR AND METHOD OF MANUFACTURING THE SAME

(71) Applicant: Texas Instruments Deutschland GMBH, Freising (DE)

(72) Inventors: Christoph Dirnecker, Eching (DE); Berthold Staufer, Moosburg (DE)

(73) Assignee: Texas Instruments Deutschland GmbH, Freising (DE)

( * ) Notice: Subject to any disclaimer, the term of this patent is extended or adjusted under 35 U.S.C. 154(b) by 51 days.

(21) Appl. No.: 13/653,461

(22) Filed: Oct. 17, 2012

(65) Prior Publication Data
US 2014/0103489 A1 Apr. 17, 2014

(51) Int. Cl.
*H01L 21/02* (2006.01)

(52) U.S. Cl.
USPC .......................................... 257/532; 257/536

(58) Field of Classification Search
USPC ................... 257/532, 536, E27.044, E27.116
See application file for complete search history.

(56) References Cited

U.S. PATENT DOCUMENTS 7,696,603 B2 * 4/2010 Beach ........................... 257/532

* cited by examiner

*Primary Examiner* — Mark Prenty
(74) *Attorney, Agent, or Firm* — Eugene C. Conser; Frederick J. Telecky, Jr.

(57) ABSTRACT

An electronic device comprising a semiconductor structure having an integrated circuit back end capacitor and an integrated circuit back end thin film resistor and a method of manufacturing the same is provided. The semiconductor structure comprises a first dielectric layer, a bottom plate of the capacitor and a thin film resistor body. Furthermore, there is a second dielectric layer which is disposed on the bottom plate of the capacitor and on top of the thin film resistor body. A top plate of the capacitor is disposed on the second dielectric layer in a region of the second dielectric layer which is defined by the lateral dimensions of the bottom plate of the capacitor. The bottom plate and the resistor body are laterally spaced apart layers which are both disposed on the first dielectric layer and which are composed of a same thin film material.

9 Claims, 3 Drawing Sheets

ELECTRONIC DEVICE COMPRISING A SEMICONDUCTOR STRUCTURE HAVING AN INTEGRATED CIRCUIT BACK END CAPACITOR AND THIN FILM RESISTOR AND METHOD OF MANUFACTURING THE SAME

FIELD OF THE INVENTION

The invention relates to an electronic device comprising a semiconductor structure having an integrated circuit back end capacitor and an integrated circuit back end thin film resistor. Furthermore, the invention relates to a method of manufacturing the electronic device.

BACKGROUND

Back end thin film capacitor structures according to the prior art "compete" with interconnect metallization routing in the metallization layers of a semiconductor device. Document US 2007/0170546 A1 discloses a back end thin film capacitor structure having a thin film capacitor comprising a top plate which is located in a metallization layer of a semiconductor device. However, this top plate of the capacitor takes valuable floor space in the metallization routing layer.

Thin film capacitors according to the prior art, for example a metal-insulator-metal capacitor (MIM capacitor), consume area in the interconnect level it is been built on. For example, an area which is occupied by a top plate or by a bottom plate of a thin film capacitor is not available for regular metallization routing in the metallization layer. Frequently, chip size increases or a level of interconnects increases due to the addition of a thin film capacitor in a semiconductor structure.

SUMMARY

It is an object of the invention to provide an electronic device comprising a semiconductor structure having an integrated circuit back end capacitor and an integrated circuit back end thin film resistor, wherein the capacitor and the resistor should be easy to integrate in existing semiconductor processes and chip area or floor space of the capacitor and the resistor should not compete with metallization routing in the semiconductor device.

An electronic device comprising a semiconductor structure having an integrated circuit back end capacitor and an integrated circuit back end thin film resistor and a method of manufacturing the same is provided. The semiconductor structure comprises a first dielectric layer, a bottom plate of the capacitor and a thin film resistor body. Furthermore, there is a second dielectric layer which is disposed on the bottom plate of the capacitor and on top of the thin film resistor body. A top plate of the capacitor is disposed on the second dielectric layer in a region of the second dielectric layer which is defined by the lateral dimensions of the bottom plate of the capacitor. The bottom plate and the resistor body are laterally spaced apart layers which are both disposed on the first dielectric layer and which are composed of a same thin film material.

In one aspect of the invention, an electronic device is provided which comprises a semiconductor structure having an integrated circuit back end capacitor and an integrated circuit back end thin film resistor. The semiconductor structure comprises a first dielectric layer. In particular, this first dielectric layer may be deposited on top of a first metallization layer of the semiconductor structure. After deposition of this first dielectric layer, planarization of this layer may be performed. Deposition and planarization may be performed according to standard process steps in a semiconductor process.

The term "back end", frequently used within the context of this specification, describes the integration of components including the integration of thin film capacitors and thin film resistors on a partially fabricated integrated circuit structure. Previously, transistors and polycrystalline silicon structures have been formed in the integrated circuit. While a so called "front end" process typically includes process steps which are performed at process temperatures in a range of 600° C. to 700° C., a "back end" process typically includes process steps which are performed at lower temperatures which are roughly about 450° C.

Furthermore, the electronic device according to aspects of the invention comprises a bottom plate of the capacitor and a thin film resistor body. In particular, the bottom plate of the capacitor and a thin film resistor body are arranged in a same layer at a same height in the semiconductor structure. A second dielectric layer is disposed on top of the bottom plate of the capacitor and on top of the thin film resistor body. A top plate of the capacitor may be disposed on top of the second dielectric layer in a region of the second dielectric layer which is defined by the lateral dimensions of the bottom plate of the capacitor.

A deposition in a region of another structure, in this case in the region which is defined by the lateral dimensions of the bottom plate of the capacitor, means that the lateral dimensions of the deposited structure are equal to or smaller than the lateral dimensions of the structure which is underneath. In other words, in a top view, an area of the top plate of the capacitor is equal to or smaller than the area of the bottom plate of the capacitor. Furthermore, a deposition of a first layer on top of a second layer may be read as a deposition directly on top of the respective layer.

The bottom plate and the resistor body are laterally spaced apart layers. They are formed in a same layer of the semiconductor structure and are both disposed on the first dielectric layer. The bottom plate of the capacitor and the resistor body of the thin film resistor are composed of a same thin film material.

Patterning of the bottom plate and the resistor body, patterning of the second dielectric layer and patterning of the top plate may be performed according to standard semiconductor process steps, including the typical process steps of photoresist deposition, etching, cleaning, etc. Advantageously, there is no change of the standard semiconductor process which is performed between deposition of two subsequent metallization or routing layers. Furthermore, area consumption in the metallization routing layers is significantly reduced at neutral mask count. There is an integration of two masks only at the back end of line (BEOL) which means one for the capacitor and one for the thin film resistor. Interconnect levels above and below the capacitor and the resistor can be used for routing because the capacitor and the resistor do not consume additional floor space in the metallization routing layers.

According to an advantageous embodiment of the invention, the thin film material of the bottom plate and the resistor body and the material of the top plate of the capacitor is metallic material. In other words, the material is metallic with respect to its electric properties and in particular with respect to its electric conductivity. Furthermore, the thin film material which is applied for manufacturing the bottom plate of the capacitor and the thin film resistor body may be SiCr. According to another advantageous embodiment of the invention, the second dielectric layer is silicon nitride ($Si_3N_4$). According to another advantageous aspect of the invention, the top plate of the capacitor is manufactured using a metallic material (with regard to its electric conductivity), for example using titanium nitride (TiN).

According to still another advantageous embodiment of the invention, the semiconductor structure of the electronic device further comprises a third dielectric layer which is disposed on the top plate of the capacitor. Furthermore, the third dielectric layer is disposed on the second dielectric layer in a region other than that which is defined by the lateral dimensions of the bottom plate of the capacitor. Planarization steps may be performed on the third dielectric layer according to standard semiconductor process steps.

Advantageously, the semiconductor structure of the electronic device may comprise a first vertical interconnect extending through a first vertical via. The first vertical interconnect may extend through the third dielectric layer and may be further coupled to the top plate of the capacitor. The first vertical interconnect is for providing an electrical contact to the top plate of the capacitor.

According to another advantageous embodiment of the invention, there is a second vertical interconnect extending through a second vertical via, wherein the second vertical interconnect extends through the third dielectric layer. Preferably, the second vertical interconnect and the second vertical via, respectively, extend entirely through the third dielectric layer and extend in third dielectric layer only. Furthermore, the second vertical interconnect is coupled to the bottom plate of the capacitor. This second vertical interconnect is for providing an electrical contact to the bottom plate of the capacitor. Advantageously, the second dielectric layer which is disposed between the bottom plate and the top plate of the capacitor serves as an etch stop during manufacture of the second vertical via.

According to another embodiment of the invention, the semiconductor structure of the electronic device comprises a third vertical interconnect extending through a third vertical via. The third vertical interconnect extends through the third dielectric layer and is coupled to the thin film resistor body. This third vertical interconnect provides an electrical contact to the thin film resistor body. Advantageously, the second vertical interconnect (which contacts the bottom plate of the capacitor) and the third vertical interconnect (which contacts the thin film resistor body) may be manufactured during a single and common process step. The second dielectric, which is disposed on top of the resistor body and on top of the bottom plate of the capacitor, serves as an etch stop during manufacture of the second and third vertical via, respectively.

Advantageously, there is a second metallization layer in the semiconductor structure according to aspects of the invention. This second metallization layer is disposed on the third dielectric layer. Preferably, the first vertical interconnect electrically contacts the top plate of the capacitor to the second metallization layer. Furthermore, the second vertical interconnect may electrically contact or connect the bottom plate of the capacitor to the second metallization layer. The third vertical interconnect may electrically connect the thin film resistor body to the second metallization layer.

According to another aspect of the invention, a method of manufacturing an electronic device comprising a semiconductor structure having an integrated circuit back end capacitor and an integrated circuit back end thin film resistor is provided. A first dielectric layer is deposited. Furthermore, a bottom plate of the capacitor and a thin film resistor body is deposited, wherein both, the bottom plate and the resistor body are deposited on the first dielectric layer. Advantageously, the bottom plate and the resistor body are deposited in a common and single process step. Furthermore, the bottom plate and the resistor body may be composed of a same thin film material which may be a metallic material, for example, SiCr may be applied.

The method according to aspects of the invention further comprises the step of depositing a second dielectric layer on top of the bottom plate of the capacitor and on top of the thin film resistor body. The bottom plate and the resistor body are laterally spaced apart layers which are both disposed on the first dielectric layer. Furthermore, a top plate of the capacitor is deposited on top of the second dielectric layer in a region of the second dielectric layer which is defined by the lateral dimension of the bottom plate of the capacitor. The top plate of the capacitor may be manufactured using a metallic material having an electric conductivity similar to a metal, for example, TiN may be applied.

Necessary patterning steps, for example for manufacture of the laterally spaced apart bottom plate and the resistor body, may be performed according to standard process steps in semiconductor processing and may include the typical steps of photoresist deposition, etching, cleaning, etc.

According to an advantageous embodiment of the invention, a first metallization layer of the semiconductor structure is deposited first. A third dielectric layer may be deposited on top of the top plate of the capacitor and on top of the second dielectric layer. The third dielectric layer may be deposited on top of the second dielectric layer in a region which is defined by the lateral dimension of the thin film resistor. Furthermore, a second metallization layer of the semiconductor structure may be deposited. The deposition of the first metallization layer of the semiconductor structure is performed before deposition of the first dielectric layer, deposition of the bottom plate of the capacitor and the thin film resistor body, deposition of the second dielectric layer and deposition of a top plate of the capacitor. Deposition of the second metallization layer is performed after deposition of these layers.

Same or similar advantages which have been already mentioned with respect to the electronic device according to aspects of the invention apply to the method of manufacturing the electronic device in a same or similar way and are therefore not repeated.

BRIEF DESCRIPTION OF DRAWINGS

Further aspects and characteristics of the invention ensue from the following description of preferred embodiments of the invention with reference to the accompanying drawings, wherein FIGS. 1 to 6 schematically illustrate successive process steps involved in manufacturing a thin film back end capacitor and thin film back end resistor in an electronic device, according to embodiments of the invention.

DETAILED DESCRIPTION OF EXAMPLE EMBODIMENTS

FIGS. 1 to 6 illustrate a sequence of basic processing operations which can be used for integrating various kinds of back end thin film capacitors and/or various kinds of back end thin film resistors into a semiconductor structure of an electronic device, according to embodiments of the invention. The back end thin film capacitor and the back end thin film resistor can be interconnected by a single level of interconnect metallization.

Figure 1:
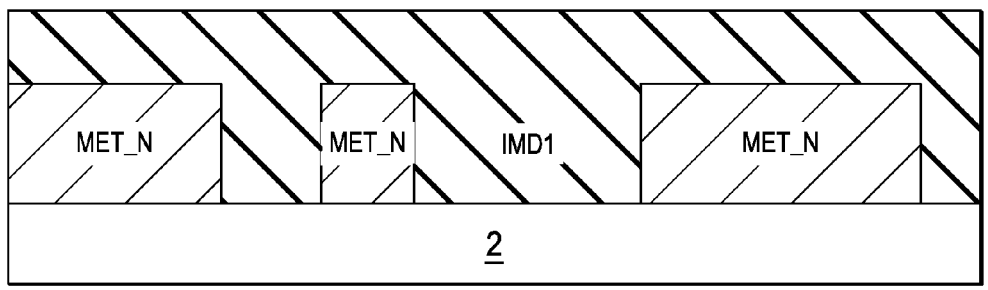

Referring to FIG. 1, a starting silicon substrate 2 may comprise various active and passive devices (not shown) such as bipolar transistor and/or MOS transistors which have been formed already in various areas of the silicon substrate 2. A standard metallization and routing layer MET_N is provided on the silicon substrate 2, wherein the routing traces are covered by a first intermetal dielectric layer IMD1. After deposition, this first intermetal dielectric layer IMD1 may be planarized according to standard process steps in semiconductor fabrication.

Figure 2:
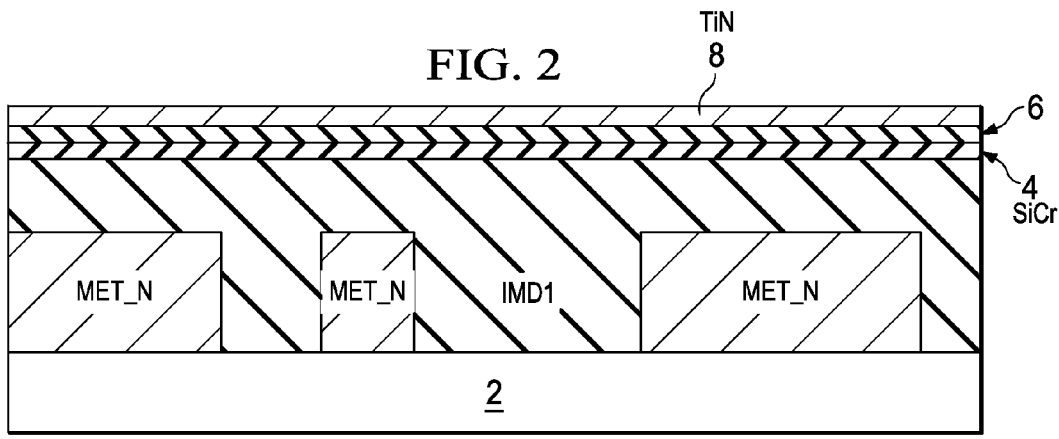

In FIG. 2, a thin film layer 4 such as sichrome (SiCr), a second dielectric layer 6 (for example a silicon nitride layer ($Si_3N_4$)) and metallic layer 8 such as a titanium nitride (TiN) are deposited subsequently on top of the first intermetal dielectric layer IMD1. In particular, these layer may be directly adjacent to each other. The sichrome layer 4 may have a typical sheet resistance ranging from 30 Ω/square to 2000 Ω/square. The sichrome layer 4 is deposited on the upper surface of the first intermetal dielectric layer IMD1. The second dielectric layer 6 ($Si_3N_4$) is deposited on top of the sichrome layer 4. Furthermore, the titanium nitride layer 8 is deposited directly on top of the second dielectric layer 6. Advantageously, deposition of the three layers 4, 6, 8 is performed according to standard process steps in semiconductor fabrication which are typically performed between deposition of subsequent metal or routing layers.

The sichrome layer 4 is applied for manufacturing a bottom plate of a thin film capacitor and a body of a thin film resistor. To provide a bottom plate of the thin film capacitor which is separate or laterally spaced apart from the body of the thin film resistor, the sichrome layer 4 is patterned. This patterning may be performed according to standard process steps in semiconductor fabrication.

Figure 3:
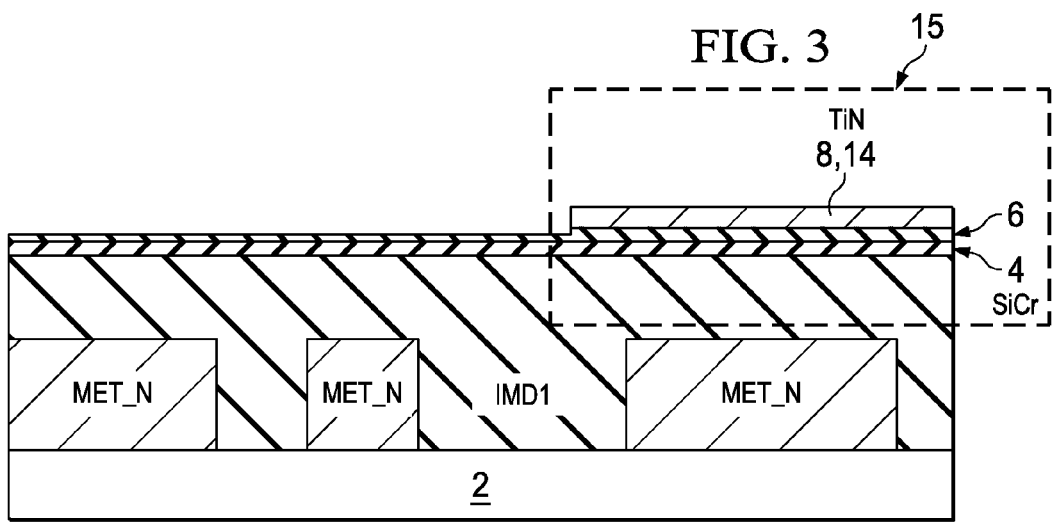

In FIG. 3, first patterning and etch back steps have been performed so as to provide a top plate 14 of the thin film capacitor 15 in the titanium nitride layer 8. Advantageously, the second dielectric layer 6 provides an etch stop during the standard patterning and etch back steps which may be performed using conventional photoresist deposition, etching and cleaning steps, etc., according to conventional semiconductor technology.

Figure 4:
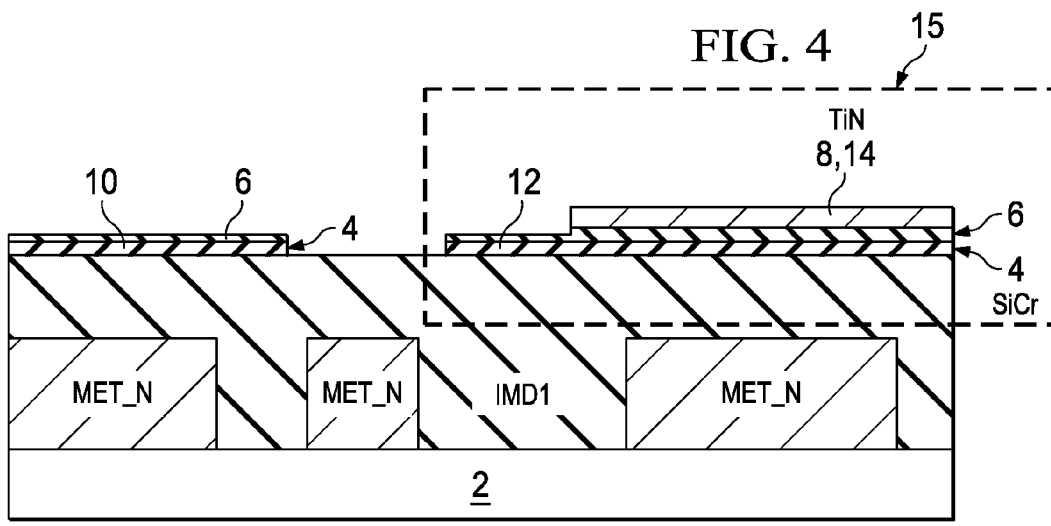

In FIG. 4, patterning of the sicrome layer 4 has been performed so as to provide a thin film resistor body 10 and a bottom plate 12 of the thin film back end capacitor 15. Patterning of the sichrome layer 4 may be performed according to standard semiconductor process steps comprising deposition of photoresist, etch back and cleaning. The second dielectric layer 6, which is arranged on top of the resistor body 10, serves as an insulation for the resistor body 10 with respect to subsequent layers. The second dielectric layer 6 which is resides on the bottom plate 12 of the capacitor 15 acts as a dielectric layer of the thin film capacitor 15. The titanium nitride layer 8 which covers at least a part of the second dielectric layer 6 and which is arranged on top of the bottom plate 12 of the capacitor 15, provides a top plate 14 of the thin film capacitor 15.

Figure 5:
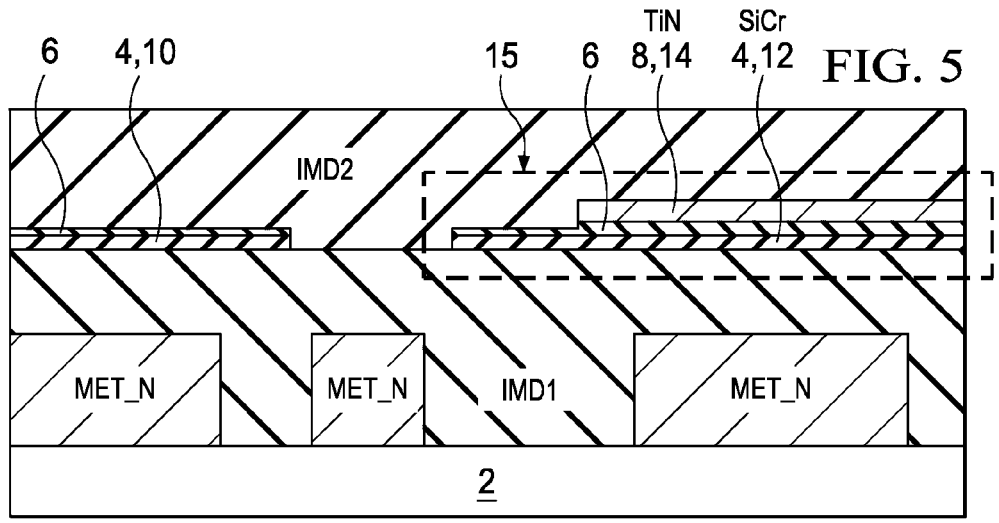

In FIG. 5, a second intermetal dielectric layer IMD2, which is the third dielectric layer, is deposited on top of the structure which is known from FIG. 4. This second intermetal dielectric layer IMD2 may undergo further process steps such as planarization. The second intermetal dielectric layer IMD2 provides a basis for further metallization layers which may be used for routing of traces in a semiconductor structure.

Figure 6:
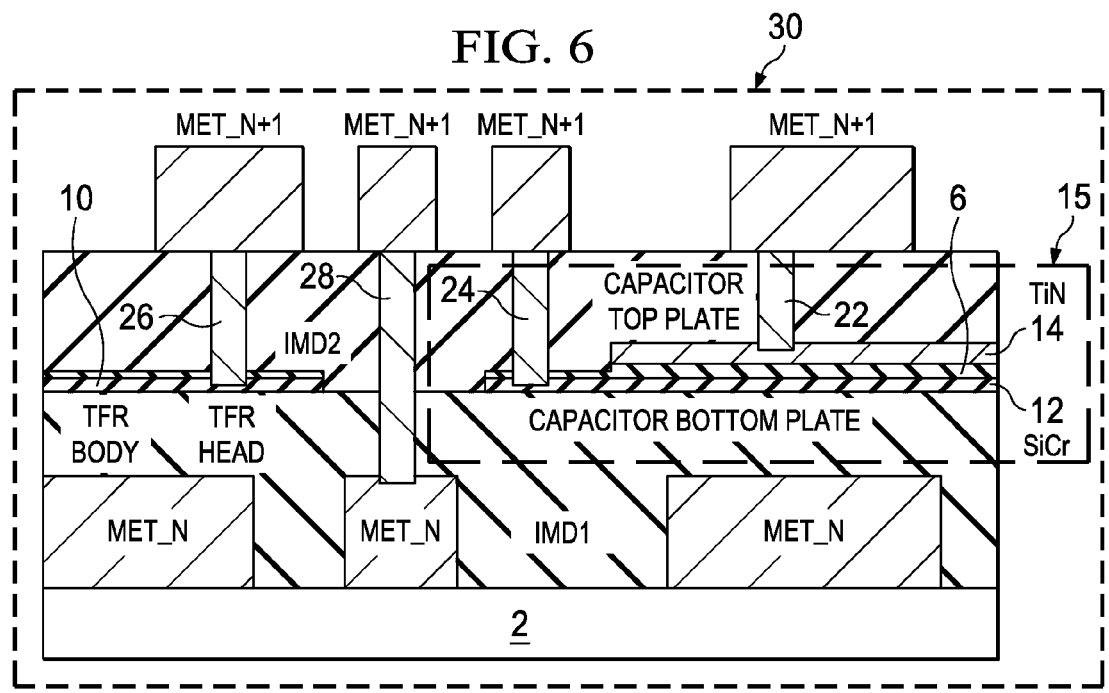

In FIG. 6, there is a further metallization layer MET_N+1 which is deposited on top of the second intermetal dielectric layer IMD2. Furthermore, there are vertical vias for electrically coupling the thin film resistor body 10, the bottom plate 12 and the top plate 14 of the capacitor 15 to this second metallization layer MET_N+1. There is a first vertical interconnect 22 extending through a first vertical via for connecting the top plate 14 of the capacitor 15 to the second metallization layer MET_N+1. A second vertical interconnect 24 electrically contacts the bottom plate 12 of the capacitor 15 to the second metallization layer MET_N+1. A third vertical interconnect 26 provides an electrical contact to a head of the thin film resistor body 10 and to the further metallization layer MET_N+1. The thin film resistor, i.e. the thin film resistor body 10 is not shown in its entirety. However, parts of the thin film resistor which are not shown, for example an opposite end, may be configured similar to the resistor parts which are depicted in FIG. 6. Those skilled in the art will recognize that a lateral size of the thin film resistor body 10 may be varied so as to adjust the resistance of the thin film resistor. The metallization layer MET_N+1 may be applied for electrically contacting the thin film resistor and the thin film capacitor 15. The vertical interconnects 22, 24 and 26 entirely project through the second intermetal dielectric layer IMD2 of the semiconductor structure. By way of an example only, there is a further vertical via 28 for connecting routing traces in the first metallization layer MET_N with trances in the second metallization layer MET_N+1.

Furthermore, in FIG. 6, there is an electronic device 30 according to an embodiment of the invention. The electronic device 30 comprises the semiconductor structure which is manufactured according to the process steps which have been illustrated in FIGS. 1 to 6 and which may be performed according to aspects of the invention. The electronic device 30 may comprise further active and passive components which are not shown due to a simplification of the drawings only.

Although the invention has been described hereinabove with reference to specific embodiments, it is not limited to these embodiments and no doubt further alternatives will occur to the skilled person that lie within the scope of the invention as claimed.

The invention claimed is:

1. An electronic device comprising a semiconductor structure having an integrated circuit back end capacitor and an integrated circuit back end thin film resistor, the semiconductor structure comprising:
   a first dielectric layer;
   a bottom plate of the capacitor and a thin film resistor body;
   a second dielectric layer disposed on the bottom plate of the capacitor and on the thin film resistor body and
   a top plate of the capacitor disposed on the second dielectric layer in a region of the second dielectric layer which is defined by the lateral dimensions of the bottom plate of the capacitor,
   wherein the bottom plate and the resistor body are laterally spaced apart layers which are both disposed on the first dielectric layer and which are composed of a same thin film material;
   wherein the first dielectric layer is deposited on a first metallization layer of the semiconductor structure;
   wherein the thin film material for the bottom plate of the capacitor and for the thin film resistor body is composed of SiCr, the second dielectric layer is composed of silicon nitride and the top plate of the capacitor is composed of titanium nitride.

2. The electronic device according to claim 1, wherein the thin film material of the bottom plate and the resistor body and the material of the top plate of the capacitor is metallic material.

3. The electronic device according to claim 1, further comprising a third dielectric layer which is disposed on the top plate of the capacitor and which is disposed on the second dielectric layer in a region which is defined by the lateral dimensions of the thin film resistor body.

4. The electronic device according to claim 3, further comprising a first vertical interconnect extending through a first vertical via, wherein the first vertical interconnect extends through the third dielectric layer and the first vertical interconnect is coupled to the top plate of the capacitor.

5. The electronic device according to claim 4, further comprising a second vertical interconnect extending through a second vertical via, wherein the second vertical interconnect extends through the third dielectric layer, and wherein the second vertical interconnect is coupled to the bottom plate of the capacitor.

6. The electronic device according to claim 5, further comprising a third vertical interconnect extending through a third vertical via, wherein the third vertical interconnect extends through the third dielectric layer, and wherein the third vertical interconnect is coupled to the thin film resistor body.

7. The electronic device according to claim 3, wherein a second metallization layer of the semiconductor structure is disposed on the third dielectric layer.

8. The electronic device according to claim 7, wherein the first vertical interconnect is for electrically connecting the top plate of the capacitor to the second metallization layer, the second vertical interconnect is for electrically connecting the bottom plate of the capacitor to the second metallization layer and the third vertical interconnect is for electrically connecting the thin film resistor layer to the second metallization layer.

9. The electronic device according to claim 6, wherein the second dielectric layer which is disposed on the bottom plate of the capacitor and on the thin film resistor body layer is an etch-stop layer for the patterning of the top capacitor plate.

* * * * *